(12) United States Patent
Laou et al.

(10) Patent No.: US 7,303,997 B1
(45) Date of Patent: Dec. 4, 2007

(54) REGIONALLY THINNED MICROSTRUCTURES FOR MICROBOLOMETERS

(75) Inventors: Philips Laou, Sainte-Foy (CA); Merel Philippe, Sainte-Foy (CA)

(73) Assignee: Her Majesty the Queen in Right of Canada as represented by the Minister of National Defence of Her Majesty's Canadian Government, Ottawa (CA)

( * ) Notice: Subject to any disclaimer, the term of this patent is extended or adjusted under 35 U.S.C. 154(b) by 0 days.

(21) Appl. No.: 11/544,591

(22) Filed: Oct. 10, 2006

(51) Int. Cl.
*H01L 21/302* (2006.01)
(52) U.S. Cl. .................... 438/712; 438/720; 250/338.2
(58) Field of Classification Search ................ 438/712, 438/714, 719, 720, 723, 724, 725; 216/67; 250/336.1, 338.2
See application file for complete search history.

(56) References Cited

U.S. PATENT DOCUMENTS

| | | | |
|---|---|---|---|
| 5,288,649 A * | 2/1994 | Keenan ........................ | 438/54 |
| 6,198,098 B1 * | 3/2001 | Laou ........................ | 250/338.1 |
| 6,307,194 B1 * | 10/2001 | Fitzgibbons et al. ..... | 250/208.1 |
| 6,388,255 B1 * | 5/2002 | Di Maio et al. ......... | 250/338.2 |
| 2003/0062480 A1 * | 4/2003 | Kanzaki .................. | 250/338.1 |
| 2003/0141453 A1 * | 7/2003 | Reed et al. .............. | 250/338.1 |
| 2004/0173751 A1 * | 9/2004 | Komobuchi et al. ..... | 250/338.1 |

* cited by examiner

*Primary Examiner*—Kin-Chan Chen
(74) *Attorney, Agent, or Firm*—George A. Seaby

(57) ABSTRACT

Microbolometers with regionally thinned microbridges are produced by depositing a thin film (0.6 μm) of silicon nitride on a silicon substrate, forming microbridges on the substrate, etching the thin film to define windows in a pixel area, thinning the windows, releasing the silicon nitride, depositing a conductive YBaCuO film on the bridges, depositing a conductive film (Au) on the YBaCuO film, and removing selected areas of the YBaCuO and conductive films.

7 Claims, 3 Drawing Sheets

REGIONALLY THINNED MICROSTRUCTURES FOR MICROBOLOMETERS

BACKGROUND OF THE INVENTION

1. Field of the Invention

This invention relates to a method of producing a microbolometer.

2. Discussion of the Prior Art

It is sometimes desirable to use thin microbridges in microbolometers to reduce the response time of the bolometer. Improved response time is the result of a reduction of the thermal mass of the microbolometers. However, the use of thin microbridges increases the risk of a reduction of the mechanical strength of pixels, leading to less robust imaging systems.

Thinning of the microbridges also affects sensitivity and detectivity of microbolometers. Indeed, thin microbridges have smaller thermal time constants ($\tau$) and thermal conductances (G). Since the signal-to-thermal noise ratio of microbolometers is proportional to the $(\tau/G)^{1/2}$, it is important to optimize this value by choosing the appropriate microbridge design.

GENERAL DESCRIPTION OF THE INVENTION

The object of the present invention is to provide a method of producing regionally thinned microbolometers having relatively high mechanical strength and sensitivity.

Accordingly, the invention relates to a method of producing a microbolometer comprising the steps of:

(a) depositing a thin film of a compound selected from the group consisting of silicon nitride, silicon dioxide and vanadium oxide on a substrate formed of a material selected from the group consisting of silicon, GeAs, GeLnP, quartz, a metal oxide and a ceramic;
(b) forming microbridges on the substrate;
(c) defining windows in a pixel area of the microbridges;
(d) etching the windows making them thinner than the remainder of the pixel area;
(e) releasing the thin film by chemical etching;
(f) depositing a thin film of material selected from the group consisting of YBaCuO, a nickel iron alloy, amorphous silicon, germanium, a low temperature superconductor and a high temperature superconductor on the bridges;
(g) depositing a conductive film on the thin film; and
(h) removing selected areas of thin and conductive films.

More specifically, the invention relates to a method of producing a microbolometer comprising the steps of:

(a) depositing a thin film of silicon nitride on a silicon substrate;
(b) forming microbridges on the substrate;
(c) defining windows in a pixel area of the microbridges;
(d) etching the windows making them thinner than the remainder of the pixel area;
(e) releasing the silicon nitride film by chemical etching;
(f) depositing a thin YBaCuO film on the bridges;
(g) depositing a conductive film on the YBaCuO film; and
(h) removing selected areas of the YBaCuO and conductive films.

BRIEF DESCRIPTION OF THE DRAWINGS

The invention is described below in greater detail with reference to the accompanying drawings, wherein.

DESCRIPTION OF THE PREFERRED EMBODIMENT

Figure 1:
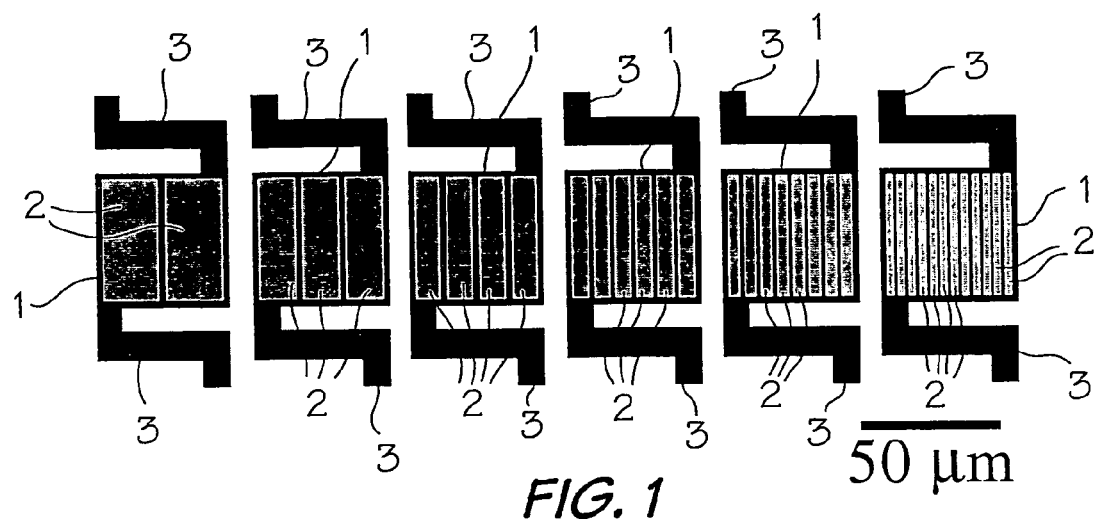
FIG. 1 is a schematic top view of microbolometers prepared in accordance with the present invention.

The six different regionally thinned microbolometers having 2, 3, 4, 6, 8 and 12 windows shown in FIG. 1 were produced using microfabrication techniques [P. Laou, L. Ngo Phong, "Effects of Bridge pattern on performance of YBaCuO microbolometers", J. Vac. Sci. Technol. A 20, 1659 (2002)]. Each microbolometer includes a generally rectangular microbridge 1 having a plurality of windows 2 therein, the windows 2 (gray areas in FIG. 1) being thinner than the remainder of the microbridge 1. Generally L-shaped supporting arms 3 extend outwardly from diagonally opposed corners of the microbridges 1 for mounting the microbolometers in an apparatus.

Table I lists the width (in μm) of the different windows 2. Each sample consists of a total of 48 pixels where there are four pixels of each design and 24 standard pixels. The presence of all of the pixels on the same sample permits a comparison of their performance without the possible effect of different processing conditions.

TABLE I

Windows dimensions

| Number of windows on microbridge | Width of windows (μm) |
| --- | --- |
| 2 | 22 |
| 3 | 14 |
| 4 | 10 |
| 6 | 6 |
| 8 | 4 |
| 12 | 2 |

A 0.6 μm thick silicon nitride ($Si_3N_4$) thin film was deposited by chemical vapor deposition (CVD) on a silicon substrate. Microbridges were first defined using UV lithography and the silicon nitride thin film was then etched using reactive plasma etching (RIE) in a $He/CHF_3/SF_6$ gas mixture. In a second lithography step, the windows on the pixel were defined and the thickness of the window regions was reduced to 0.3 μm. The $Si_3N_4^+$ membranes were then released by chemical etching of the silicon substrate using KOH solution at 70° C. A 0.1 μm thick YBaCuO thin film was then sputtered on the microbridges by RF magetron sputtering with the following conditions: Ar pressure of 3 mTorr, RF power of 40 W and a deposition time of 4 hours. This material is the active component of the device. Since its resistivity changes—as temperature changes, the incident radiation to the YBaCuO film can be measured by monitoring the change of resistance as the YBaCuO film and the underneath $Si_3N_4$ microbridge expose to infrared radiation. A 0.15 μm Au thin film is deposited on top of the YBaCuO thin film also using RF magnetron sputtering. This final layer is used as an electrical conductor. Two lithography steps combined with chemical etching of the YBaCuO and Au thin films complete the microbolometer fabrication. The resulting microbolometers have resistance values ranging from 0.2 to 2 MΩ.

The sensitivity (S) and the detectivity (D*) of the microbolometers were measured at different bias currents. A glow bar was used as the infrared source. A chopper (f=10 Hz) was used to modulate the power on the microbolometers and the voltage modulation was measured using a lock-in amplifier. The percentage change in resistance with temperature (TCR) of the microbolometers was measured from 285 to 315 K. τ was evaluated by measuring the sensitivity as a function of frequency using the following equation[3].

$$S=R\eta(TCR)I/G(1+w^2\tau^2)^{1/2}$$   Equation 1

Where R is the resistance of the microbolometer, η is the absorption coefficient, I is the bias current, G the thermal conductance, and w the modulation of angular frequency of the incident radiation.

Table 2 presents τ and G of a standard pixel and three designs of regionally thinned microbolometers having 3, 6 and 12 windows. As expected, and for all the thin pixel designs, τ was reduced by about a factor 1.6 compared to the standard pixel. However, the different values of G do not present a clear result. These values could be affected by processing issues such as gold coverage of the microbolometers.

TABLE II

Thermal time constant and thermal conduction of regionally thinned microbolometers

| Microbolometer Design | Thermal time constant τ (ms) | Thermal conductance G (μW/K) |
|---|---|---|
| Standard Pixel | 2.6 | 2.1 |
| 3 windows | 1.7 | 2.3 |
| 6 windows | 1.6 | 4.6 |
| 12 windows | 1.5 | 3.0 |

Figure 2:
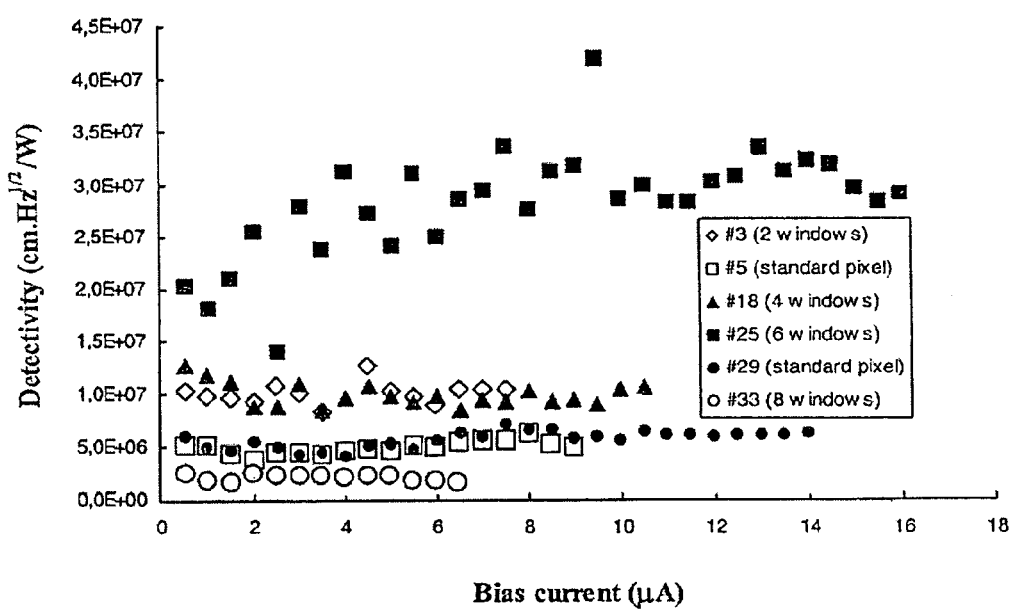
FIG. 2 is a graph of detectivity of standard and regionally thinned microbolometers as a function of bias current with a modulation frequency (f) of 10 Hz.

From the results presented in Table II, it is clear that the regionally thinning of the microbridges reduces, as expected, the time response of the microbolometers. But it is also important to know the impact on detectivity of these designs. FIG. 2 presents the detectivity of standard and regionally thinned microbolometers as a function of bias current with a modulation frequency (f) of 10 Hz. It is first observed that the two standard pixels (#5 and #29) have a very similar detectivity at around $5\times10^6$ cm-Hz$^{1/2}$/W. This value will serve as baseline for comparison. The two and four windows design show a detectivity about a factor of two higher than that of the standard pixels at about $1\times10^7$ cm-Hz$^{1/2}$/W. The six windows design presents the highest detectivity at about $3\times10^7$ cm-Hz$^{1/2}$/W. Only the eight windows design shows a lower D* than that of the standard pixels at about $2.5\times10^6$ cm-Hz$^{1/2}$/W.

These results show that f=10 Hz, the detectivity is maintained or increased for regionally thinned microbridges compared to the standard pixels. However, at this low frequency, the biggest D* limitation might be 1/f noise. Johnson noise also limits D*, not only the thermal noise. Also, The TCR values of the different microbolometers were measured to be uniform at about −2.5% K.

A finite element model was constructed with 8-noded iso-parametric hexahedral elements to capture the three-dimensional features of the thinned sections in the pixel area. The thermal element had a single degree of freedom (temperature) at each node. The structural element had three degrees of freedom, x, y and z displacement, at each node. The micron-kilogram-second units were used in place of the standard meter-kilogram-second units to accommodate the micron-based geometry. Therefore, pressure is expressed in mega-pascals (MPa), heat flux is in terms of pico-Watts (pW) and energy has the units pico-Joules (pJ).

The idealized thickness distribution of the $Si_3N_4$, YBaCuO and Au layers for the standard bolometer configuration are given in Table III. Compared to the pixel area linear dimensions (50 μm×50 μm), the aspect ratio of area length (l) to layer thickness (t) varies between 167<l/t<500. A mesh sensitivity study was carried out to determine a suitable aspect ratio that would minimize the structural and thermal elemental energy error norms. It was found that each layer had to be at least two elements thick to capture the bending stresses from pressure loading. The error norm increased as the l/t ratio increased as expected. To achieve a reasonable energy norm of less than 0.1 and to stay within the memory capacity of the computer being used, the surface area dimensions of an element were selected to be 0.5 μm×0.5 μm thereby giving aspect ratios ranging from 3.3<l/t<10. A thinner bolometer configuration without a layer 3 and 4 was also included. The dimensions for this configuration are given in Table IV. The material properties used in this study are given in Table V.

TABLE III

Idealized thickness distribution of bolometer materials for standard configuration

| Layer | Material | Thickness (μm) | Cumulative Thickness (μm) |
|---|---|---|---|
| 6 | Au | 0.15 | 0.85 |
| 5 | YBaCuO | 0.1 | 0.7 |
| 4 | $Si_3N_4$ | 0.2 | 0.6 |
| 3 | $Si_3N_4$/YBaCuO | 0.1 | 0.4 |
| 2 | $Si_3N_4$ | 0.3 | 0.3 |
| 1 | — | — | 0 |

TABLE IV

Idealized thickness distribution of bolometer materials for thin configuration

| Layer | Material | Thickness (μm) | Cumulative Thickness (μm) |
|---|---|---|---|
| 6 | Au | 0.15 | 0.694 |
| 5 | YBaCuO | 0.1 | 0.544 |
| 4 | $Si_3N_4$ | 0.444 | 0.444 |
| 1 | — | 11 | 0 |

TABLE V

Material properties

| Property | $Si_3N_4$ | YBaCuO | Au |
|---|---|---|---|
| Modulus (MPa) | $310 \times 10^3$ | $310 \times 10^3$ | $77.2 \times 10^3$ |
| Poisson ration (—) | 0.27 | 0.27 | 0.42 |
| Density (kg/μm$^3$) | $3290 \times 10^{-18}$ | $3290 \times 10^{-18}$ | $19320 \times 10^{-18}$ |
| Thermal Expansion (K$^{-1}$) | $3.3 \times 10^{-6}$ | $3.3 \times 10^{-6}$ | $14.4 \times 10^{-6}$ |
| Specific heat (pJ/kg-K) | $680 \times 10^{12}$ | $544 \times 10^{12}$ | $132.3 \times 10^{12}$ |
| Thermal conductivity (pW/μm-K) | $30 \times 10^6$ | $10 \times 10^6$ | $301 \times 10^6$ |

YBaCuO mechanical properties are assumed equal to $Si_3N_4$ properties.

A comparative approach was employed for the finite element study because actual structural and thermal loading conditions were not available. The structural load was defined as a surface pressure that arises from processing operations. A nominal value of 0.01 MPa was used in the calculations. The free ends of the microbridge's arms were fully constrained from moving. For thermal loading, a heat flux of 1640 pW/$\mu m^2$ was selected. This value was based on experimental measurements. The temperature at the free ends of the micro-bridge's arms was fixed at 0 K.

Figure 3:
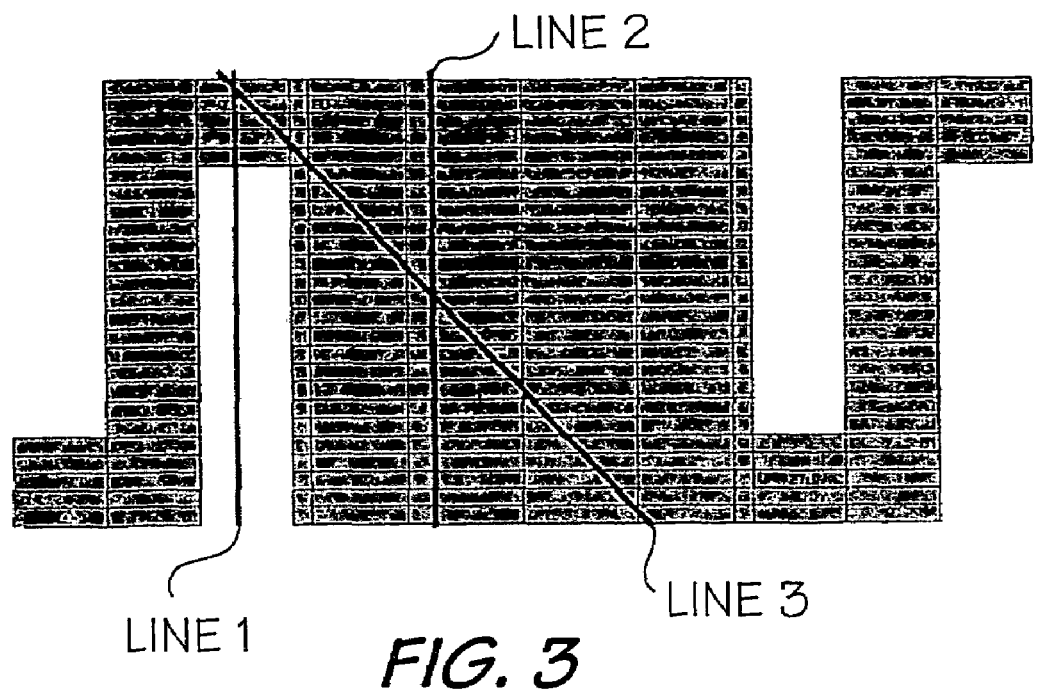
FIG. 3 is a schematic top view of the microbolometer of FIG. 1 showing regions where structural test results were taken.

FIG. 3 shows the regions where results were taken. Structural performances were evaluated along Line 1 and Line 2. Thermal performances were compared with results taken along Line 3. Baseline results were calculated from a standard pixel.

Figure 4:
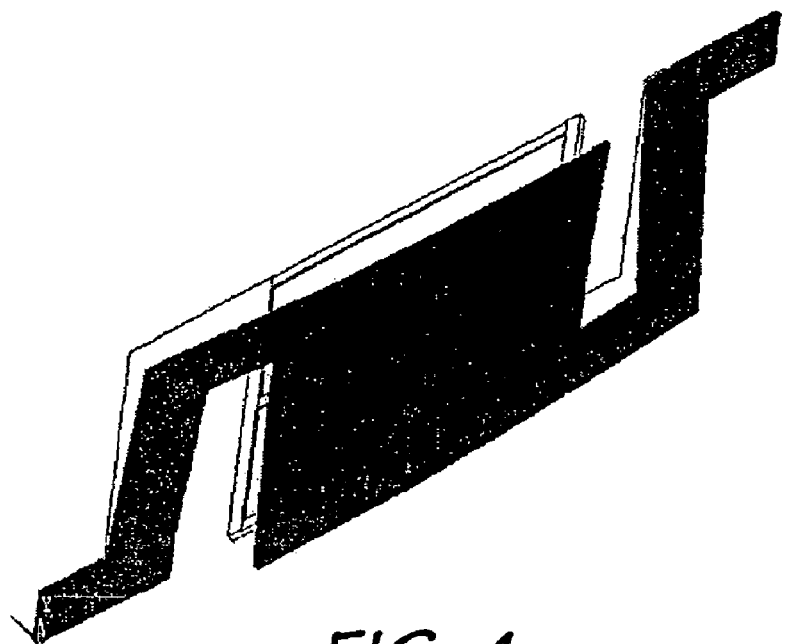
FIG. 4 is an schematic, isometric view of a bolometer showing how a microbolometer deforms under pressure.
Figure 5:
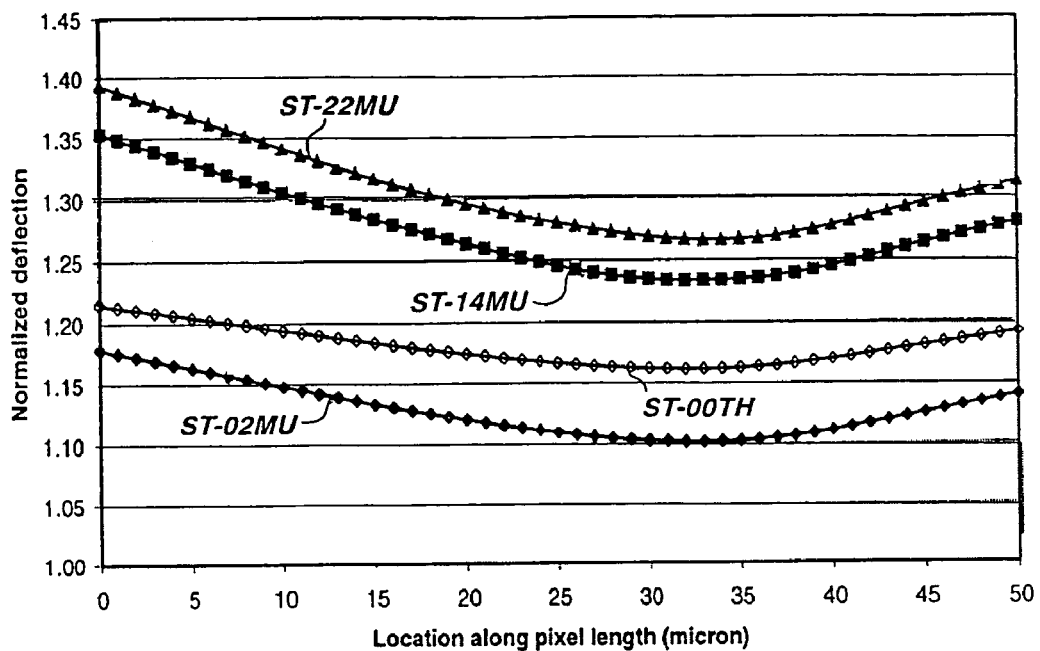
FIGS. 5 and 6 are graphs of deflection versus location along a pixel length showing how a microbolometer deforms under pressure.
Figure 6:
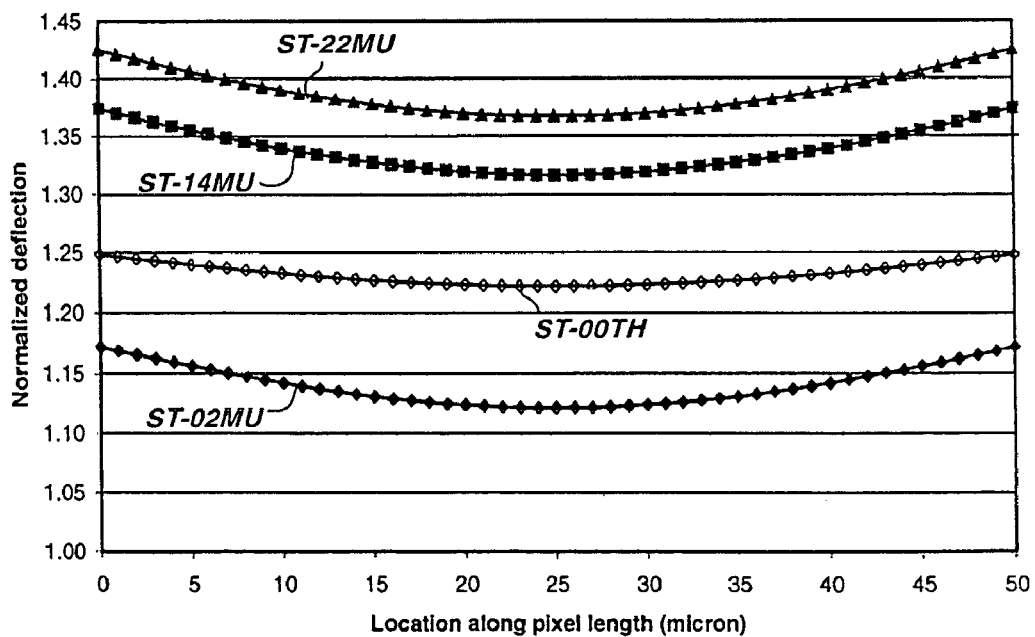

FIG. 4 shows how the microbolometer generally deforms under pressure loading. The structural impact of thinning the active pixel area is shown in FIGS. 5 and 6. Generally, the more the pixel deforms under pressure, the higher the stresses and strains in the material, along the edge of the pixel (see FIG. 5), deformation increases from where the bolometer arms are attached to the pixel. The reductions in stiffness as compared to the baseline pixel are 18%, 35% and 39% for the 12 (ST-02MU), 3(ST-14MU) and 2(ST-22MU) windows designs, respectively. The relative loss in stiffness between 3 and 2 windows is much less than the relative loss in stiffness between 12 and 3 windows designs. Because there are no trenches, the thinned pixel (ST-00TH) is more flexible than the 12 windows configuration (22%). Along the pixel centerline (see FIG. 6), the 12 and 3 windows configurations experience similar reductions in stiffness at y=0 as found in the edge results. The loss in $Si_3Ni_4$ for 2 windows has a larger effect on the centerline deflections. The thinned pixel is more deformed than the 12 windows configuration in the center as well.

Temperature contours were determined at steady state condition under a uniform heat flux. Using this information, relative values for $\tau$, G and the ratio $(\tau/G)^{1/2}$ for different microbolometer configurations were evaluated. This information is presented in Table VI, which provides simulated values for the thermal time constant and thermal conduction of regionally thinned microbolometers compared to a standard pixel.

TABLE VI

Simulated values for the thermal time constant and the thermal conduction of regionally thinned microbolometers compared to a standard pixel

| Microbolometer design | $\tau$ (a.u.) | G (a.u.) | $(\tau/G)^{1/2}$ (a.u.) |
|---|---|---|---|
| Standard pixel (thickness of 0.6 μm) | 1 | 1 | 1 |
| Standard pixel (thickness of 0.444 μm) | 1 | 0.94 | 1.03 |
| 12 windows | 0.87 | 0.94 | 1.03 |
| 3 windows | 0.87 | 0.91 | 0.98 |
| 2 windows | 0.87 | 0.90 | 0.98 |

The first observation is that the standard pixel with a thickness of 0.444 μm and the 12 windows configuration have very similar thermal characteristics. For these two cases, the $(\tau/G)^{1/2}$ ratio, which is proportional to the signal-to-thermal noise ratio, is higher than that of the standard pixel with a thickness of 0.6 μm. As the amount of material removed is increased (the 3 and 2 windows cases), the thermal time constant drops significantly. This increased speed is accompanied by a modest drop of the $(\tau/G)^{1/2}$ ratio, suggesting that the reduced response time will not cause a significant drop in detectivity D*. The absorption coefficient η was assumed to be constant for all pixel types.

Microbolometers with regionally thinned microbridges have been produced by the method of the present invention. Experimental results show that the regionally thinned microbridges have a lower thermal time constants (about 1.6 ms) than the standard pixel configuration (2.6 ms). On the other hand, the regionally thinned microbolometers show D* values comparable to or even six times superior to that of the standard pixel. This implies that the increased speed is not accompanied by a loss of detection performance.

The simulation results show that the 12 windows design, which has the same thermal properties as the 0.44 μm thick standard pixel, will have a 22% higher stiffness. This confirms the validity of the regionally thinned microbridge approach. Also, as the amount of material removed is increased, the thermal time constant drops significantly while the $(\tau/G)^{1/2}$ ratio only decreases slightly, suggesting that the increased speed will not cause a significant drop in detectivity D*, in total agreement with the experimental results.

It should be noted that although specific materials have been selected for different purposes, it will be appreciated that other materials, which are mentioned above, can be used. For example, the suspended surface membrane or microbridge ($Si_3N_4$ in the foregoing) may be silicon dioxide, and the thermally sensitive thin film (YBaCuO in the foregoing) may be made of nickel iron alloy, amorphous silicon, germanium, or a layer of low temperature superconductor or high temperature superconductor.

Moreover, the microbridge may also be a metal oxide, e.g. vanadium oxide which maximizes the temperature coefficient of resistance (TCR). The substrate may also be a germanium compound such as GeAs or GeLnP, quartz, a metal oxide or a ceramic. The electrodes may be indium tin oxide or a metal.

The present invention can be applied to any type of thermodetector such as bolometric and pyroelectric. The invention, using a bulk micromachining technique, could be used with a micromachining technique to produce a thermodetector.

The invention claimed is:

1. A method of producing a microbolometer comprising the steps of:
    (a) depositing a thin film of a compound selected from the group consisting of silicon nitride, silicon dioxide and vanadium oxide on a substrate formed of a material selected from the group consisting of silicon, GeAs, GeLnP, quartz, a metal oxide and a ceramic;
    (b) forming microbridges on the substrate;
    (c) defining windows in a pixel area of the microbridges;
    (d) etching the windows making them thinner than the remainder of the pixel area;
    (e) releasing the thin film by chemical etching;
    (f) depositing a thin film of material selected from the group consisting of YBaCuO, a nickel iron alloy, amorphous silicon, germanium, a low temperature superconductor and a high temperature superconductor on the microbridges;
    (g) depositing a conductive film on the thin film; and
    (h) removing selected areas of thin and conductive films.

2. A method of producing a microbolometer comprising the steps of:
    (a) depositing a thin film of silicon nitride on a silicon substrate;

(b) forming microbridges on the substrate;
(c) defining windows in a pixel area of the microbridges;
(d) etching the windows making them thinner than the remainder of the pixel area;
(e) releasing the silicon nitride film by chemical etching;
(f) depositing a thin YBaCuO film on the microbridges;
(g) depositing a conductive film on the YBaCuO film; and
(h) removing selected areas of the YBaCuO and conductive films.

3. The method of claim 2, wherein the conductive layer is Au.

4. The method of claim 3, wherein the microbridges are formed using UV lithography.

5. The method of claim 4, wherein the thin film is etched in step (c) using reactive plasma etching.

6. The method of claim 5, wherein the reactive plasma etching is carried out in a $He/CHF_3/SF_6$ gas mixture.

7. The method of claim 3, wherein the YBaCuO and Au are deposited by RF magetron sputtering.

* * * * *